(12) United States Patent
Suzuki

(10) Patent No.: US 12,154,789 B2
(45) Date of Patent: Nov. 26, 2024

(54) ETCHING METHOD USING HALOGEN FLUORIDE AND METHOD FOR PRODUCING SEMICONDUCTOR

(71) Applicant: SHOWA DENKO K.K., Tokyo (JP)

(72) Inventor: Atsushi Suzuki, Tokyo (JP)

(73) Assignee: Resonac Corporation, Tokyo (JP)

( * ) Notice: Subject to any disclaimer, the term of this patent is extended or adjusted under 35 U.S.C. 154(b) by 342 days.

(21) Appl. No.: 17/414,041

(22) PCT Filed: Dec. 9, 2019

(86) PCT No.: PCT/JP2019/048054
§ 371 (c)(1),
(2) Date: Jun. 15, 2021

(87) PCT Pub. No.: WO2020/129725
PCT Pub. Date: Jun. 25, 2020

(65) Prior Publication Data
US 2022/0051898 A1    Feb. 17, 2022

(30) Foreign Application Priority Data
Dec. 21, 2018    (JP) ................. 2018-239515

(51) Int. Cl.
*H01L 21/3065*    (2006.01)
*H01L 21/311*    (2006.01)

(52) U.S. Cl.
CPC .... *H01L 21/3065* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| | | |
|---|---|---|
| 4,310,380 A | 1/1982 | Flamm et al. |
| 5,698,070 A | 12/1997 | Hirano et al. |
| 5,851,861 A * | 12/1998 | Suzawa ............... H01L 29/6659 |
| | | 257/E29.269 |
| 6,387,287 B1 | 5/2002 | Hung et al. |
| 9,082,725 B2 | 7/2015 | Kimura et al. |
| 10,079,150 B2 | 9/2018 | Neumann, Jr. et al. |

(Continued)

FOREIGN PATENT DOCUMENTS

| | | |
|---|---|---|
| JP | 8-134651 A | 5/1996 |
| JP | 2002-543612 A | 12/2002 |

(Continued)

OTHER PUBLICATIONS

Communication dated Jan. 5, 2021 from the Taiwanese Patent Office in corresponding Application No. 108145647.

(Continued)

*Primary Examiner* — Roberts P Culbert
(74) *Attorney, Agent, or Firm* — Sughrue Mion, PLLC

(57) ABSTRACT

A method for precise plasma etching of micropatterns on a silicon substrate containing silicon or additionally having a silicon oxide film. An etching method for plasma-etching a silicon substrate having silicon or a silicon oxide film using a halogen fluoride having a nitrogen ($N_2$) content of 1 vol % or less as an etching gas. Also disclosed is a method for producing a semiconductor using the etching method.

5 Claims, 1 Drawing Sheet

(56) References Cited

U.S. PATENT DOCUMENTS

| | | |
|---|---|---|
| 10,287,499 B2 | 5/2019 | Takahashi et al. |
| 10,607,850 B2 | 3/2020 | Surla et al. |
| 11,430,663 B2 | 8/2022 | Surla et al. |
| 2003/0098288 A1 | 5/2003 | Mori et al. |
| 2014/0199852 A1 | 7/2014 | Kimura et al. |
| 2014/0305590 A1* | 10/2014 | Yamaguchi ....... H01L 21/67017 156/345.29 |
| 2016/0086814 A1* | 3/2016 | Takahashi ......... H01L 21/31116 438/724 |
| 2017/0025282 A1 | 1/2017 | Neumann, Jr. et al. |
| 2017/0178923 A1 | 6/2017 | Surla et al. |
| 2018/0251679 A1 | 9/2018 | Takahashi et al. |
| 2019/0355590 A1 | 11/2019 | Suzuki et al. |
| 2020/0203174 A1 | 6/2020 | Surla et al. |

FOREIGN PATENT DOCUMENTS

| | | |
|---|---|---|
| JP | 2008-177209 A | 7/2008 |
| JP | 2015-060934 A | 3/2015 |
| JP | 2016-139782 A | 8/2016 |
| JP | 6080166 B2 | 2/2017 |
| JP | 2018-107438 A | 7/2018 |
| JP | 2018-166205 A | 10/2018 |
| TW | 201614105 A | 4/2016 |
| TW | 201710555 A | 3/2017 |
| WO | 2018/126206 A1 | 7/2018 |

OTHER PUBLICATIONS

Written Opinion of The International Searching Authority dated Feb. 4, 2020 in in Application No. PCT/JP2019/048054.
Communication dated Jun. 11, 2021 from the Taiwanese Patent Office in corresponding Application No. 108145647.
International Search Report dated Feb. 4, 2020 in Application No. PCT/JP2019/048054.

* cited by examiner

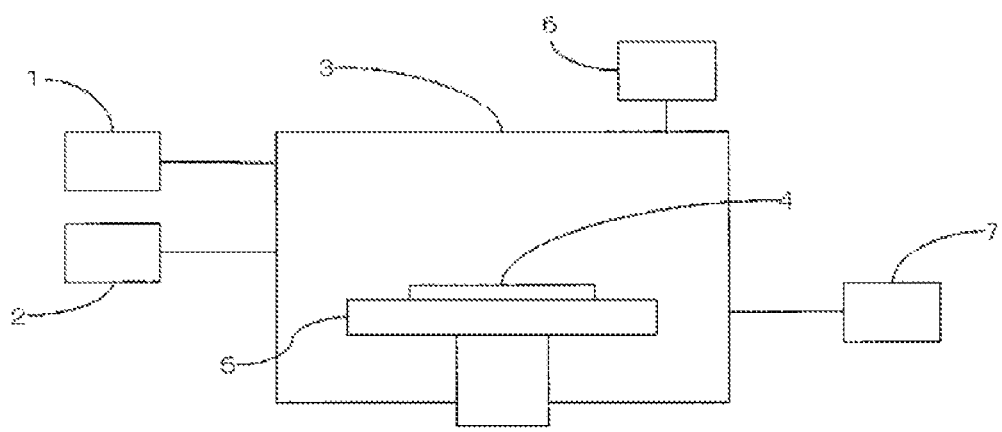

ETCHING METHOD USING HALOGEN FLUORIDE AND METHOD FOR PRODUCING SEMICONDUCTOR

CROSS REFERENCE TO RELATED APPLICATIONS

This application is a National Stage of International Application No. PCT/JP2019/048054 filed Dec. 9, 2019, claiming priority based on Japanese Patent Application No. 2018-239515 filed Dec. 21, 2018

TECHNICAL FIELD

The present invention relates to a semiconductor production process using a halogen fluoride having a low $N_2$ content.

In more detail, the present invention relates to a method for precisely etching silicon or a silicon oxide film by using a halogen fluoride having a $N_2$ content of 1 vol % or less and to a method for producing a semiconductor using said etching method.

BACKGROUND ART

Recently, ultrafine processing techniques have been required in the field of semiconductor production, and the dry etching method has become the mainstream in place of the wet method.

In the dry etching method, plasma is generated in a vacuum space and micropatterns are formed on a substance surface on a molecular basis.

For etching a semiconductor material such as silicon dioxide ($SiO_2$), in order to increase the etching speed of $SiO_2$ with respect to silicon, polysilicon and silicon nitride, etc. used as base materials, perfluorocarbons (PFC) and hydrofluorocarbons (HFC) such as $CF_4$, $CHF_3$, $C_2F_6$, $C_3F_8$ and $C_4F_8$ have been used as etching agents.

However, these PFCs and HFCs both have long atmospheric life durations and high global warming potential values (GWP), so that they are designated as emission control substances in accordance with the Kyoto Protocol (COP3).

In the semiconductor industry, an alternative substance that can be used for micropatterning, having high economic efficiency and low GWP has been demanded.

Therefore, the present inventors have paid attention to using a halogen fluoride as an etching gas in the semiconductor production process.

For example, Patent Literature 1 discloses a method that laminated film is formed by laminating an insulating film and polysilicon film, holes are formed so as to penetrate the laminated film, and then one or two or more gases selected from $ClF_3$, $BrF_5$, $IF_3$, $IF_7$, $ClF$, $BrF_3$, $IF_5$ and BrF, which are diluted by an inert gas are introducing into the holes to etch isotropically and selectively a polysilicon film.

Patent Literature 1 relates to etching under the condition where no plasma is generated and describes examples of using $N_2$ as a diluent gas.

CITATION LIST

Patent Literature

Patent Literature 1: JP 6080166 B

SUMMARY OF INVENTION

Technical Problem

Recently, processing patterns in semiconductor integrated circuit production processes have become remarkably miniaturized and therefore development of a dry etching technique with high precision (high selectivity, high aspect ratio and high speed) has been strongly demanded.

In normal etching, as an inert gas or a deposition agent and a diluent, $N_2$ may be included.

However, the present inventors consider that, when using the halogen fluoride as the etching gas, during a high precision dry etching, when $N_2$ exists in the etching gas, silicon nitride is generated by the reaction of the fluorinated silicon generated and the $N_2$ when plasma-etching silicon and a silicon oxide film, and the generated silicon nitride accumulates on the substrate to become a hindrance factor for micromachining.

Further, when the halogen fluoride is consumed due to the halogen fluoride reacting with the silicon nitride, there is also concern about reduction of an etching rate.

While Patent Literature 1 describes the example of using $N_2$ as the diluent gas, etching is performed under the condition of not generating plasma and therefore Patent Literature 1 does not imply at all any influence of nitride film generation at the time of the plasma generation.

Solution to Problem

Under these circumstances, the present inventors made an eager examination in order to solve the above problem and, as a result, have found out that, in a halogen fluoride etching gas for etching a semiconductor wafer having silicon or a silicon oxide film, by adjusting the content of nitrogen to be equal to or lower than a predetermined amount, the influence of the nitride film can be remarkably alleviated, thus completing the present invention.

The gist of the present invention is as follows.

[1] An etching method for plasma-etching a silicon substrate containing silicon or in addition having a silicon oxide film using a halogen fluoride having a nitrogen ($N_2$) content of 1 vol % or less as an etching gas.

[2] The etching method according to [1], wherein a halogen fluoride is at least one selected from $ClF_3$, $BrF_5$, $IF_3$, $IF_7$, $ClF$, $BrF_3$, $IF_5$ and BrF.

[3] The etching method according to [1] or [2], wherein an etching gas further contains 90 vol % or less of a diluent gas selected from Ar, Ne, Kr and Xe.

[4] The etching method according to [1] to [3], comprising the steps of:
providing a mask in a silicon substrate containing silicon or in addition having a silicon oxide film, transporting the substrate into a processing chamber and mounting the substrate on a mount table inside the processing chamber;
decompressing the inside of the processing chamber; supplying the etching gas into the processing chamber; and
forming plasma inside the processing chamber to perform anisotropic etching based on an electric potential difference between the plasma and the mounted substrate.

[5] A method for producing a semiconductor using the etching method according to [1] to [4].

Advantageous Effects of Invention

According to the present invention, the $N_2$ content in the etching gas composed of halogen fluoride is adjusted to be equal to or lower than a predetermined amount and therefore it is possible to provide a method for precisely etching silicon or a silicon oxide film.

BRIEF DESCRIPTION OF DRAWINGS

The FIGURE is a schematic drawing showing an etching device used in the present invention.

DESCRIPTION OF EMBODIMENTS

Hereinafter, the embodiments of the present invention are described below.
In the etching method according to the present invention, silicon or a silicon oxide film on a substrate surface is etched by using a halogen fluoride.

Substrate

Substrates are not particularly limited as far as they can be processed by plasma etching and include, for example, glass substrates, silicon substrates and GaAs substrates.

Among these substrates, silicon substrates are suitable in the present invention when using the silicon substrates which are used as semiconductor wafers, because they allow etching to be performed precisely.

On the silicon substrates, silicon oxide films and the like are formed for example.

The silicon oxide film indicates a film composed of a silicon compound containing oxygen atoms such as $SiO_2$, SiOC and SiOCH, etc.

Further, organic films and metal films processed to have predetermined patterns may also be provided on the substrates as masks.

The organic film has carbon as a main component and concretely indicates a film (hereinafter referred to as "resist film") composed of a carbon-based material such as amorphous carbon and a resist composition.

The resist composition is not particularly limited and includes, for example, a fluorine-containing resin composition and a non-fluorine-containing (meth)acrylic-based resin composition.

Further, the metal films include Ni and Cr, etc.

According to the present invention, silicon or silicon oxide on a substrate surface is etched to engrave remarkably highly integrated micropatterns on a substrate surface.

The plasma etching is a technique of applying a high frequency electric field to a processing gas to cause conversion into plasma, separating the processing gas into chemically active ions, electrons and neutral species, and performing etching by utilizing chemical reactions as well as reactions due to physical impacts, between these active species and the substrate.

Halogen Fluoride Gas

According to the present invention, a halogen fluoride gas having a nitrogen content adjusted to be equal to or lower than a predetermined range is used as an etching gas.

This allows the silicon oxide film to be etched in a highly selective manner, so that generation of silicon nitride can be restricted.

As a halogen fluoride, one or at least two selected from $ClF_3$, $BrF_5$, $IF_3$, $IF_7$, $ClF$, $BrF_3$, $IF_5$ and $BrF$ is/are used. Among these, the halogen fluoride preferably contains $ClF_3$, $BrF_3$, $BrF_5$, $IF_5$ and $IF_7$ and, more preferably, it contains $IF_7$, $ClF_3$ and $BrF_5$.

The boiling point of the halogen fluoride is preferably 50° C. or lower and, more preferably, 40° C. or lower. If the boiling point is within the above range, when the halogen fluoride gas is introduced into a plasma etching device, liquefaction inside a pipe can be prevented, so that occurrence of failures caused by the liquefaction can be avoided, thus enabling efficiency of the plasma etching process.

The $N_2$ content in the halogen fluoride is 1 vol % or lower, desirably 0.5 vol % or lower, preferably 1 vol % or lower, more preferably 0.05 vol % or lower, more preferably 0.01 vol % or lower and still more preferably 0.005 vol %.

If the $N_2$ content is large, fluorinated silicon generated by the reaction of silicon or the silicon oxide and the halogen fluoride reacts with $N_2$ under plasma conditions, so that a silicon nitride film is generated. If the silicon nitride film is deposited on the semiconductor substrate, this becomes a hindrance factor for the micromachining and a yielding percentage is reduced. If the silicon nitride film reacts with the halogen fluoride, the halogen fluoride is consumed so that an etching rate for the silicon or the silicon oxide film could be reduced.

For adjusting the $N_2$ amount, a raw material which does not contain $N_2$ may be used. Further, for example, excessive $N_2$ can be reduced by cooling a vessel and liquefying or solidifying the halogen fluoride, thereby discharging a gas phase part through a diaphragm vacuum pump, etc. Concretely, the $N_2$ amount is adjusted by preparing, collecting and cooling the halogen fluoride, substituting the gas phase part with nitrogen, and discharging the gas phase part, which remains cooled, to a predetermined pressure by means of the diaphragm vacuum pump, so that the $N_2$ content is prepared to be set to a predetermined amount as a gas composition at room temperature.

In the etching method according to the present invention, the halogen fluoride having a low $N_2$ content can be used alone as a plasma etching gas, while, generally, an inert gas may be contained as the diluent gas. Further, an additive gas may also be contained if necessary.

Other Gases

As the inert gas, at least one selected from the group consisting of Ar, Ne, Kr and Xe is used.

Further, the additive gas includes a reducing gas, fluorocarbons and hydrofluorocarbons, etc. It is possible to add, as the additive gas, at least one selected from the group consisting of, for example, $H_2$, HF, HI, HBr, HCl, $NH_3$, $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_3H_5$, $C_3F_5H$, $C_3F_3H$, $C_3ClF_3H$, $C_4F_8$, $C_4F_6$, $C_5F_8$ and $C_5F_{10}$.

The content of the inert gas may be 90 vol % or lower with respect to the total amount of the etching gas and preferably 50 vol % or lower. Further, the content of the additive gas may be 50 vol % or lower with respect to the total amount of the etching gas and preferably 30 vol % or lower.

Etching Method

The present invention comprises the steps of:
providing a mask, as described above, in a silicon substrate containing silicon or in addition having a silicon oxide film, transporting the substrate into a processing chamber and mounting the substrate on a mount table inside the processing chamber;
decompressing the inside of the processing chamber;
supplying the etching gas into the processing chamber; and forming plasma inside the processing chamber to perform anisotropic etching based on an electric potential difference between the plasma and the mounted substrate.

The etching method, which can be used in the present invention, can be adopted without being limited to various kinds of etching methods such as capacitively coupled plasma (CCP) etching, reactive ion etching (RIE), inductive coupling plasma (ICP) etching, electron cyclotron resonance (ECR) plasma etching and microwave etching, etc.

The FIGURE is a schematic drawing showing one embodiment of a reactor adopted for the etching method according to the present invention.

Inside a reaction chamber 3 comprising an introduction system 1 for the etching gas and a diluent/additive gas introduction system 2, a stage 5 is installed as a mount table having a function to apply a high frequency to the substrate. The stage 5 is connected to a high frequency power supply. The stage 5 may also have a function to heat the substrate. A heater is also installed around the chamber and may be configured to heat the chamber wall. The etching gas is made to contact with a silicon substrate 4 mounted on the stage 5, so that the silicon substrate 4 can be etched. Further, in order to put the inside of the chamber 3 in a decompressed state, a manometer 6 and a vacuum pump 7 are installed. The gas provided for the etching is exhausted through a non-illustrated gas exhaust line.

The gas components contained in the etching gas may be introduced into the reaction chamber respectively independently, or may be adjusted beforehand as a mixture gas downstream of a storage vessel and then introduced into the chamber.

The total flow rate of the etching gas to be introduced into the chamber is appropriately selected in consideration of the volume of the reaction chamber, the exhaust performance of the exhaust part and pressure conditions.

A plasma generation mechanism is provided inside the chamber 3 and this generation mechanism may be used for either applying a high frequency voltage to parallel plates, flowing a high frequency current to a coil, or applying a strong electric wave. When a high frequency is applied to the substrate in the plasma, a negative voltage is applied to the substrate, and positive ions are incident upon the substrate quickly and vertically, so that anisotropic etching can be achieved.

The pressure at the time of performing the etching is preferably 10 Pa or lower and particularly preferably 5 Pa or lower so as to obtain stable plasma. Meanwhile, if the pressure inside the chamber is too low, the ionized ions decrease and a sufficient plasma density cannot be obtained, so that the pressure is preferably 0.05 Pa or higher. Further, the substrate temperature at the time of performing the etching is preferably 200° C. or lower and, particularly in order to perform the anisotropic etching, desirably 100° C. or lower particularly. At a high temperature exceeding 150° C., the mask part, etc. other than the silicon and the silicon oxide film to be originally etched becomes etched, and thus could cause a shape abnormality.

Further, as for the biasing power constituting the electric potential difference between the plasma generated at the time of performing the etching and the substrate, it may be selected between 0 and 10000 W depending on the desired etching shape and the range from 0 to about 1000 W is preferable when performing selective etching.

The etching method according to the present invention can be used in a method for producing semiconductors. Further, the etching method according to the present invention is an etching method which allows plasma etching of an object to be processed with a silicon oxide film.

EXAMPLES

The invention according to the present embodiment will be more concretely described hereinafter in accordance with examples, but is not limited thereto.

Preparation Example 1

Iodine heptafluoride obtained by making $IF_5$ and $F_2$ react with each other in a gas phase of 250° C. was cooled to −70° C. to solidify the iodine heptafluoride, and the gas phase part was substituted with nitrogen.

The gas phase part, which remained cooled, was discharged to reach predetermined pressure by the diaphragm vacuum pump, and the $N_2$ content was prepared to be about 5, 2, 1, 0.5, 0.1, 0.05, 0.01 and 0.005 vol %, as gas compositions at room temperature (see the table below).

The compositions of the prepared iodine heptafluoride are shown in Table 1.

TABLE 1

| Sample No. | $N_2$ Concentration vol % | Iodine heptafluoride concentration vol % |
|---|---|---|
| 1 | 0.0005 | 99.9995 |
| 2 | 0.0101 | 99.9899 |
| 3 | 0.0513 | 99.9487 |
| 4 | 0.1055 | 99.8945 |
| 5 | 0.4913 | 99.5087 |
| 6 | 0.9984 | 99.0016 |
| 7 | 2.1034 | 97.8966 |
| 8 | 5.0141 | 94.9859 |

Example 1

Etching was performed on a semiconductor wafer having a silicon oxide film by using the iodine heptafluoride in Sample No. 1 prepared in the above Preparation Example 1. For the etching, an ICP etching device RIE-230iP manufactured by Samco was used.

The iodine heptafluoride in Sample No. 1 and Ar were each respectively distributed at 10 mL/min and 40 mL/min into the reaction chamber independently, and a high frequency voltage at 500 W was applied to perform conversion into plasma, thereby performing the etching. The etching was performed under etching conditions that the pressure was 3 Pa, the temperature was 20° C. and the biasing power was 100 W.

After the etching, the semiconductor wafer was extracted and, as a result of performing elemental analysis on the surface by means of X-ray photoelectron spectroscopy (XPS), it could be confirmed that no nitrogen was seen and no silicon nitride film was generated.

Examples 2 to 6

In Example 2, the etching was performed in the same manner as in Example 1 except for using the iodine heptafluoride in Sample No. 2 in place of Sample No. 1 prepared in the above Preparation Example 1.

Similarly, in Examples 3, 4, 5 and 6, the etching was performed in the same manner as in Example 1 except for using the iodine heptafluorides in Samples No. 3, 4, 5 and 6, respectively. After the etching, the semiconductor wafer was extracted and, as a result of performing elemental analysis on the surface by means of XPS, it could also be confirmed in Examples 2 to 6 that no nitrogen was seen and no silicon nitride film was generated.

Comparative Examples 1 and 2

In Comparative Examples 1 and 2, the etching was performed in the same manner as in Example 1 except for using the iodine heptafluorides in Samples Nos. 7 and 8 respectively prepared in the above Preparation Example 1. After the etching, the semiconductor wafer was extracted and, as a result of performing the elemental analysis on the surface by means of XPS, it could be confirmed in both Comparative Examples 1 and 2 that nitrogen was detected and a silicon nitride film was generated.

INDUSTRIAL APPLICABILITY

An etching method using a halogen fluoride having a low $N_2$ content is provided.

REFERENCE SIGNS LIST

1: Halogen fluoride introduction system
2: Diluent/additive gas introduction system
3: Reaction chamber
4: Silicon substrate
5: Stage
6: Manometer
7: Vacuum pump

The invention claimed is:

1. An etching method for plasma-etching a silicon substrate containing silicon or in addition having a silicon oxide film which comprises contacting the substrate with a plasma of an etching gas consisting of a halogen fluoride having a nitrogen ($N_2$) content of 0.0005 to 1 vol % as an etching gas and an inert diluent gas in an amount of 90 vol % or less so as to anisotropically etch the silicon or silicon oxide film in a decompressed state.

2. The etching method according to claim 1, wherein a halogen fluoride is at least one selected from $ClF_3$, $BrF_5$, $IF_3$, $IF_7$, $ClF$, $BrF_3$, $IF_5$ and $BrF$.

3. The etching method according to claim 1, wherein the diluent gas selected from Ar, Ne, Kr and Xe.

4. The etching method according to claim 1, comprising the steps of:
providing a mask in a silicon substrate having silicon or a silicon oxide film, transporting the substrate into a processing chamber and mounting the substrate on a mount table inside the processing chamber;
decompressing the inside of the processing chamber;
supplying the etching gas into the processing chamber; and
forming plasma inside the processing chamber to perform anisotropic etching based on an electric potential difference between the plasma and the mounted substrate.

5. A method for producing a semiconductor using the etching method according to claim 1.

* * * * *